(12) United States Patent
Chen et al.

(10) Patent No.: US 6,920,628 B2
(45) Date of Patent: Jul. 19, 2005

(54) METHOD AND APPARATUS FOR DEFINING MASK PATTERNS UTILIZING A SPATIAL FREQUENCY DOUBLING TECHNIQUE

(75) Inventors: Jang Fung Chen, Cupertino, CA (US); Douglas Van Den Broeke, Sunnyvale, CA (US)

(73) Assignee: ASML Masktools B.V., Veldhoven (NL)

( * ) Notice: Subject to any disclaimer, the term of this patent is extended or adjusted under 35 U.S.C. 154(b) by 12 days.

(21) Appl. No.: 10/395,887

(22) Filed: Mar. 25, 2003

(65) Prior Publication Data

US 2004/0006757 A1 Jan. 8, 2004

Related U.S. Application Data

(60) Provisional application No. 60/366,544, filed on Mar. 25, 2002.

(51) Int. Cl.$^7$ ................................................ G06F 17/50
(52) U.S. Cl. ........................................ 716/19; 716/20
(58) Field of Search ............................ 716/19, 20, 1–18

(56) References Cited

U.S. PATENT DOCUMENTS

| | | | |
|---|---|---|---|
| 5,553,273 A | | 9/1996 | Liebmann |
| 5,629,113 A | | 5/1997 | Watanabe |
| 5,936,868 A | * | 8/1999 | Hall ............................ 716/4 |
| 6,033,812 A | | 3/2000 | Miyagawa |
| 6,114,071 A | | 9/2000 | Chen et al. |
| 6,185,727 B1 | * | 2/2001 | Liebmann .................... 716/19 |
| 6,215,546 B1 | | 4/2001 | Chu et al. |
| 6,373,553 B1 | | 4/2002 | Singh |
| 6,482,555 B2 | | 11/2002 | Chen et al. |
| 6,541,167 B2 | | 4/2003 | Petersen et al. |
| 6,623,895 B2 | | 9/2003 | Chen et al. |
| 2002/0010904 A1 | * | 1/2002 | Ayres ......................... 716/19 |
| 2002/0026624 A1 | | 2/2002 | Ono |
| 2002/0051913 A1 | * | 5/2002 | Broeke ......................... 430/5 |

FOREIGN PATENT DOCUMENTS

| | | |
|---|---|---|
| EP | 1 174 764 A2 | 1/2002 |
| JP | 8-286358 | 11/1996 |
| JP | 2000-112113 A | 4/2000 |

* cited by examiner

Primary Examiner—A. M. Thompson
Assistant Examiner—Magid Y. Dimyan
(74) Attorney, Agent, or Firm—McDermott Will & Emery LLP (57) ABSTRACT

A method of generating a mask for use in printing a target pattern on a substrate. The method includes the steps of: (a) determining a target pattern representing a circuit design to be printed on a substrate; (b) generating a first pattern by scaling the target pattern by a factor of 0.5; and (c) generating a second pattern by performing a Boolean operation which combines the target pattern and the first pattern. The second pattern is then utilized to print the target pattern on the substrate.

18 Claims, 9 Drawing Sheets

METHOD AND APPARATUS FOR DEFINING MASK PATTERNS UTILIZING A SPATIAL FREQUENCY DOUBLING TECHNIQUE

RELATED APPLICATIONS

This application claims priority of U.S. Provisional Patent Application No. 60/366,544, filed Mar. 25, 2002.

FIELD OF THE INVENTION

The present invention relates generally to the generation of mask patterns for use with chromeless phase lithography techniques, and more specifically, for the generation of a mask pattern based on a target pattern by utilizing a spatial frequency doubling technique. In addition, the present invention relates to a device manufacturing method using a lithographic apparatus comprising a radiation system for providing a projection beam of radiation; a mask table for holding a mask, serving to pattern the projection beam; a substrate table for holding a substrate; and a projection system for projecting the patterned projection beam onto a target portion of the substrate.

BACKGROUND OF THE INVENTION

Lithographic projection apparatus (tools) can be used, for example, in the manufacture of integrated circuits (ICs). In such a case, the mask contains a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic apparatus as here described can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing. Thereafter, the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

The lithographic tool may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic tools are described, for example, in U.S. Pat. No. 5,969,441 and WO 98/40791, incorporated herein by reference.

The photolithography masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD (critical dimension) of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

Furthermore, the constant improvements in microprocessor speed, memory packing density and low power consumption for micro-electronic components are directly related to the ability of lithography techniques to transfer and form patterns onto the various layers of a semiconductor device. The current state of the art requires patterning of CD's well below the available light source wavelengths. For instance the current production wavelength of 248 nm is being pushed towards patterning of CD's smaller than 100 nm. This industry trend will continue and possibly accelerate in the next 5–10 years, as described in the International Technology Roadmap for Semiconductors (ITRS 2000).

One technique, which is currently receiving additional attention from the photolithography community, for further improving the resolution/printing capabilities of photolithography equipment is referred to as chromeless phase lithography "CPL". CPL is an emerging technology that redefines how an image is defined on the reticle as compared with all other current phase shifting mask (PSM) technologies. CPL is a technique that allows complete freedom in defining a pattern on the reticle using three possible conditions of 0 (no light transmits through the reticle), +1 (100% transmission, no phase shift), and −1 (100% transmission, 180 degree phase shift), giving a true ternary mask. With this added degree of freedom comes the challenge of how to convert a binary target design defined by the given design into a suitable mask pattern. Indeed, it is necessary for mask designers to verify that the mask structures utilizing the various techniques all interact in an acceptable manner such that the desired pattern is printed on the wafer. However, due to the complexity of today's masks, this can often be a long, tedious and difficult process.

Moreover, currently the mask design process is substantially a manual process, performed on a trial and error basis, that relies heavily on the knowledge and experience of the mask designer. As a result, the time required for designing a suitable mask, as well as the performance of the final mask, will vary greatly depending on the experience of the mask designer.

Accordingly, there exists a need for a method which provides for a substantially automated approach to designing a mask that will provide the mask designer with a mask design for reproducing the target pattern on a substrate.

SUMMARY OF THE INVENTION

In an effort to solve the foregoing needs, it is one object of the present invention to provide an substantially automated approach for generating a mask pattern based on a desired target pattern that provides a mask design for reproducing the target pattern.

More specifically, in one exemplary embodiment, the present invention relates to a method of generating a mask for use in printing a target pattern on a substrate. The method includes the steps of: (a) determining a target pattern representing a circuit design to be printed on a substrate; (b) generating a first pattern by scaling the target pattern by a factor of 0.5; and (c) generating a second pattern by performing a Boolean operation which combines the target pattern and the first pattern. The second pattern is then utilized to print the target pattern on the substrate.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a) A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

b) A programmable LCD array. An example of such a construction is given in U.S. Pat. No. 5,229,872, which is incorporated herein by reference.

The method of the present invention provides important advantages over the prior art. For example, the foregoing method provides an automated approach for generating a mask design for reproducing the target pattern. It is noted that this mask design can subsequently be modified by the mask designer, if so desired, to further optimize the performance of the mask for the given target design. Importantly, however, by providing an automated approach for forming the initial design, which is suitable for reproducing the target pattern, a substantial part of the mask design effort that in the past was performed by a trial and error process by the mask designer is now eliminated. Accordingly, the time and effort associated with mask design is advantageously reduced. Moreover, highly skilled mask designers are no longer required for producing a quality mask, as the level of skill required for optimizing the initial mask produced by the method of the present invention is less than that necessary for designing a complete mask.

Another advantage is that the present invention provides for a significant reduction in the amount of time required to generate a mask design, because the process eliminates the numerous trial and error steps that are required when generating a mask design utilizing prior art techniques.

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

BRIEF DESCRIPTION OF THE DRAWINGS

FIG. 10 illustrates the corresponding exposure-dose latitude for the mask design of FIG. 9a.

FIGS. 11a and 11b illustrate the combined mask generated in accordance with the present invention for patterning the contact hole pattern of FIG. 7a which utilizes chrome, and the aerial image resulting from imaging the mask of FIG. 11a.

FIG. 12 illustrates the corresponding exposure-dose latitude for the mask design of FIG. 11a.

FIGS. 13a and 13b show the resulting mask pattern when the spatial frequency doubled pattern utilized to form the mask in FIG. 9a was shifted in the x direction by ¼ of the horizontal pitch, and the aerial image resulting from imaging the mask of FIG. 13a.

FIG. 14 illustrates an image of a CPL mask design derived from doubled and quadrupled components of the contact hole pattern of FIG. 7a.

DETAILED DESCRIPTION OF THE INVENTION

The preferred embodiment of the present invention relates to a process for automatically generating a mask pattern for reproducing a target pattern. As explained in more detail below, the method of the present invention is especially useful when imaging dense periodic patterns (e.g., DRAM designs). Moreover, it is noted that the method of the present invention can be performed utilizing a standard CAD system (such as those noted above), which is programmed to operate in accordance with the following description.

Prior to discussing the details of the method of generating a mask in accordance with the present invention, a brief discussion concerning the theory behind the present invention is discussed. In optical lithography, a periodic pattern is known to produce a given diffraction pattern when exposed with a coherent beam of light. This diffraction pattern is a direct result of the spatial frequencies of the periodic pattern with the many spatial frequency components of a complex pattern diffracting the light at angles directly related to those frequencies. For example, the simplest periodic structure would be a line and space pattern. This pattern contains only one spatial frequency component that can be defined by the direction of the line-space pattern (i.e., vertical, horizontal, +x degrees from horizontal, −y degrees from vertical, etc.), the pitch, and the duty cycle (i.e., ratio of line size to space size).

Figure 1:
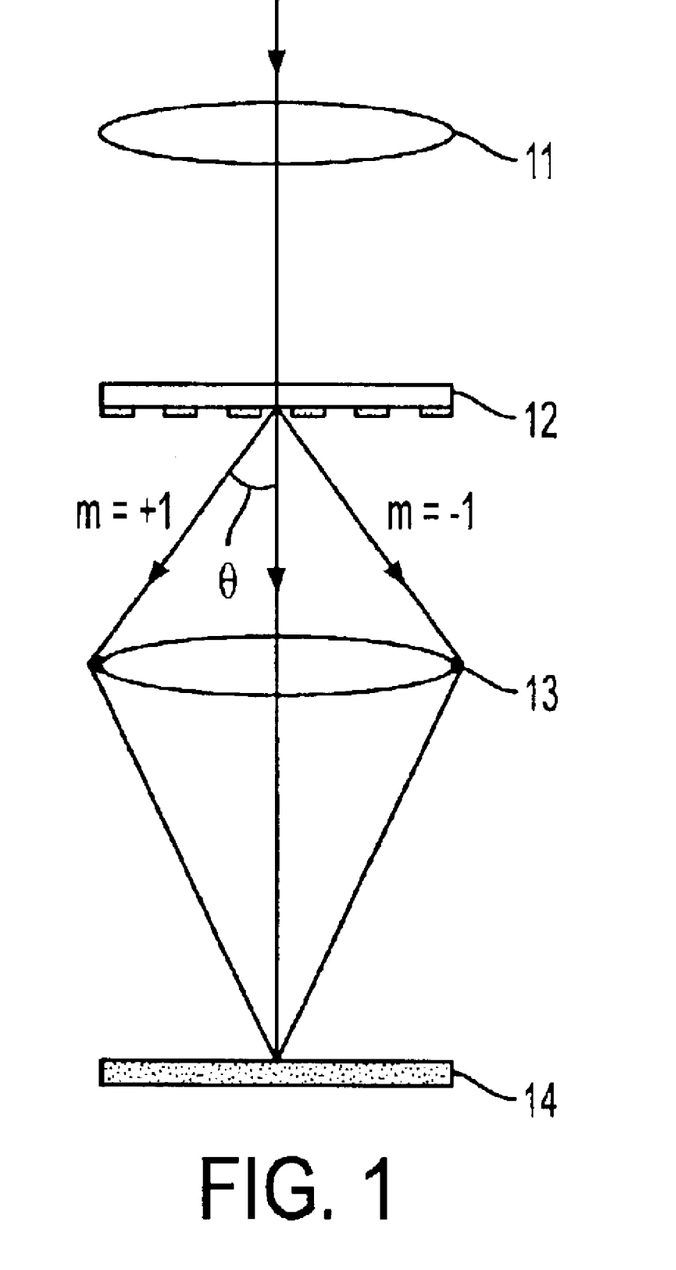
FIG. 1 illustrates an exemplary diffraction pattern generated by utilizing a mask reticle having an equal line:space pattern.

The diffraction pattern created by this line-space pattern would be along a single direction perpendicular to the direction of the line-space pattern and at angles of:

$$\theta = \sin^{-1}\{(n*\lambda)/P_x\}$$

where θ is the angle of the diffracted light, n is the diffraction order, λ is the wavelength of the light, and P is the pitch of the line-space pattern, as is shown in FIG. 1. Referring to FIG. 1, a condenser lens 11 focuses a light source on a reticle 12. The reticle 12, which in the given example, exhibits an equal line:space pattern, generates numerous diffraction orders (m) of light some of which are captured by the projection lens 13 and imaged on the substrate 14.

The third component of a periodic line-space pattern is the duty cycle. When the duty cycle of a spatial frequency component changes, the result is a change in the intensity and distribution of the light in the diffraction orders. This fact is important because it allows the intensity within the diffraction orders of the spatial frequency doubled pattern to be controlled by sizing the pattern (i.e., changing the duty cycle). As a result, by controlling the duty cycle of the pattern, there is another degree of freedom in defining CPL patterns for periodic structures.

Using this concept of spatial frequency, it can be shown that the angle of the +2 diffraction order resulting from a pattern with pitch $P_1$ will be exactly equal to the angle of the +1 diffraction order resulting from a pattern with a pitch of $P_1/2$. This concept of overlapping diffraction orders as a result of doubling the spatial frequency of a pattern (dividing the pitch by 2) is exploited by the method of the present invention to define a mask reticle pattern, for example, utilizing CPL techniques, that will provide enhanced resolution of the original periodic pattern.

As noted above, chromeless phase lithography forms an image based on a pattern of 0 (0% transmission), +1 (100% transmission and zero phase-shift), and −1 (100% transmission and 180 degree phase-shift) light passing through the reticle. Accordingly, when utilizing CPL techniques to achieve a desired image, the intended pattern (or design) must be decomposed into a ternary pattern of these components, which may have very little resemblance to the original pattern. The present invention set forth a method for accomplishing this task for various patterns, including dense periodic patterns.

Figure 2:
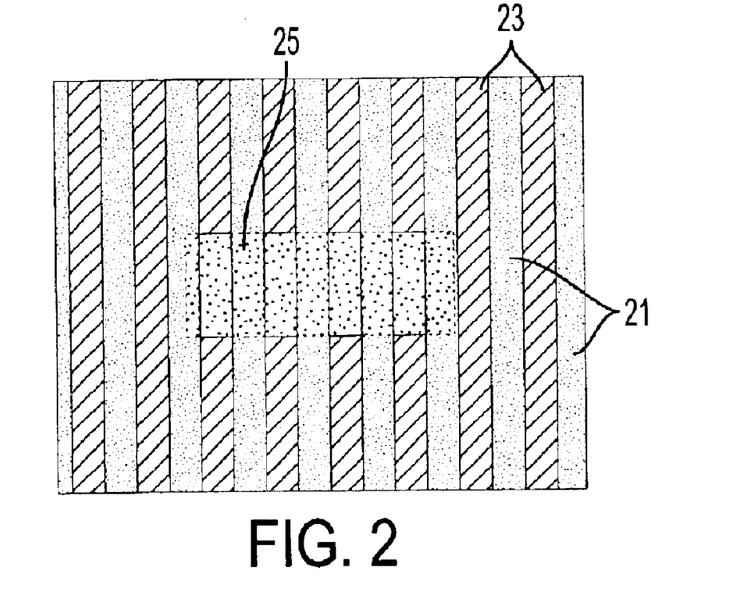
FIG. 2 illustrates an exemplary target line-space pattern having an equal line:space ratio.

FIG. 2 illustrates an exemplary line-space pattern having an equal line:space ratio. This exemplary pattern will be used to illustrate how the method of the present invention utilizes the foregoing concept of spatial frequency doubling to generate a mask reticle for imaging a substrate based on the original target pattern. Referring to FIG. 2, the target pattern contains lines 23 and spaces 21, each of which have an equal width (i.e., the equal line and space ratio). However, if a mask was created to image this pattern, and the mask only includes +1 areas (corresponding to lines) and −1 areas (corresponding to spaces) and has an equal line:space ratio, no image is formed in the wafer. This is also illustrated in FIG. 2, in which reference numeral 25 illustrates the aerial image resulting from imaging the foregoing mask. Moreover, if the mask is revised such that +1 areas and 0 areas are used for the line and space features, respectively, then the result is a simple binary pattern and no resolution enhancement is achieved. Further, changing the +1 area to a −1 area and leaving 0 unchanged has absolutely no effect; it still remains a binary pattern. This example makes clear the difficulties associated with mask design, as simply generating a mask based on the desired target pattern will not result in a mask capable of producing/imaging the target pattern on the wafer.

It is noted that it is possible to define the line as a "0" area and then alternate every other space with a "+1" area and a "−1" area, which constitutes an alternating PSM, in order to print the line space pattern set forth in FIG. 2. However, this requires that mask designer vary the mask design from the target pattern in the initial step of the design process. As noted above, in such a design process, as the pattern to be printed becomes more complex, the knowledge and abilities of the mask designer becomes an increasingly important factor in the process.

In contrast, the method of the present invention allows for the generation of a mask suitable for printing the desired target pattern by systematic manipulation of the target pattern. The first step in the process entails doubling the spatial frequency of the target pattern to create a second pattern. This is accomplished by scaling the target pattern to ½ the original size thereof. For example, if the target pattern exhibited a pitch of 200 nm (i.e., with each line and space having a width of 100 nm), the only difference between the target pattern and the second pattern would be that the second pattern exhibits a pitch of 100 nm (i.e., with each line and space having a width of 50 nm).

This first step functions to double all of the spatial frequency components of any periodic structure contained in the target pattern regardless of the complexity of the target pattern. In the foregoing example utilizing an equal line-space pattern, scaling the pattern by 50% simply changes the pitch to one half but has no effect on the duty cycle or the direction of the line-space pattern. As a result, the first diffraction order of this scaled pattern overlaps the second diffraction order of the target pattern, the second diffraction order of the scaled pattern will overlap the fourth diffraction order of the target pattern, and the third diffraction order of the scaled pattern will overlap the six diffraction order of the target pattern, and so forth. As explained below, in the second step of the process, this scaled pattern is merged with the target pattern to define a mask pattern (e.g., a +1 and −1 CPL pattern (chromeless) or a 0, +1, and −1 CPL pattern (ternary)) which can be utilized to image the target pattern on a substrate.

As stated, in the second step of the process, the scaled pattern (i.e., spatial frequency doubled pattern) is combined with the original pattern to generate a third pattern, which can be utilized to image the target pattern on the substrate. As detailed below, the method of combining the patterns is dependent upon various factors such as whether a clear field or dark field target pattern is being utilized. However, the main objective is that the target pattern and the scaled pattern are merged in such a way as to cause the spatial frequency doubled pattern to appear (or modify) what will be the dark portion of the target pattern. In the case of the contact example, it is the background (not the contact holes themselves) that changes with the merging because it will be the dark part of the pattern. In the line space example, it is the line that becomes dark that has the spatial frequency doubled components. This is true for both chromeless designs and for ternary designs.

It is noted that merging the spatial frequency doubled pattern into the original pattern results in the introduction of higher frequency orders into the original pattern as well as reinforces the original spatial frequencies that are contained in the target pattern, as these spatial frequencies are also in the spatial frequency doubled pattern. This reinforcement of the original spatial frequencies of the target pattern results in improved imaging performance of the target pattern. Indeed, as shown below, target patterns which are initially incapable of being imaged on a substrate can be imaged once subjected to the foregoing process.

Figure 3:
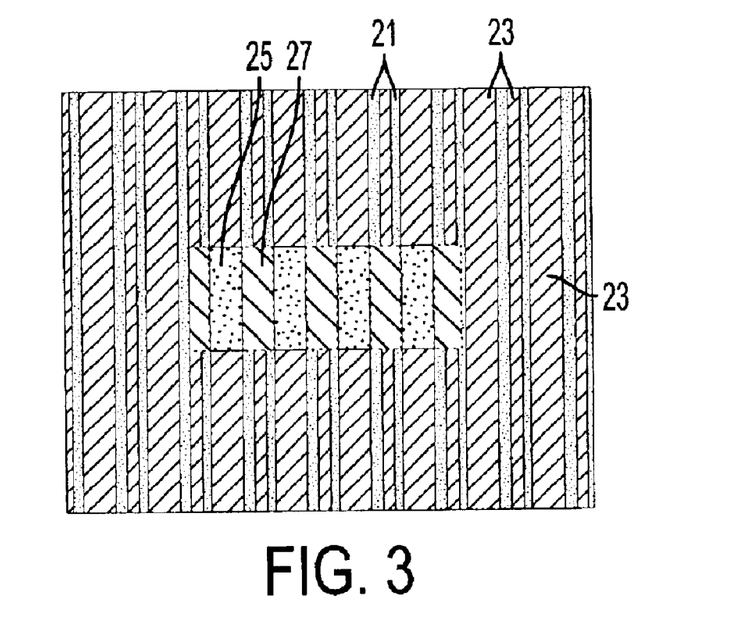
FIG. 3 illustrates an exemplary mask formed in accordance with the present invention and the results obtained by imaging the mask.

The foregoing process is illustrated by the example set forth in FIGS. 2 and 3. In this example, as shown in FIG. 2, the target pattern to be printed is a CPL pattern have +1 areas 23 (100% transmission and zero phase shift) as the pattern to be printed and −1 areas 21 (100% transmission and 180 degree phase shift) as the field. However, as explained above, forming a mask reticle directly from this target pattern will not result in the imaging of the target pattern on the wafer. Reference numeral 25 illustrates the simulated aerial image obtained when imaging the substrate utilizing a mask reticle corresponding to the target pattern illustrated in FIG. 2. As shown, the resulting aerial image is simply background light, there is no modulation and therefore no imaging. It is noted that no imaging occurs for this pattern because this pattern causes the energy in the zero order to go to zero. In order to image the pattern, the zero order and the +1 or −1 order are necessary.

FIG. 3 illustrates a mask formed in accordance with the present invention and the results obtained by imaging the mask on a substrate. More specifically, continuing the example of FIG. 2, as stated, the target pattern is a CPL pattern having +1 areas 23 to be printed and −1 areas 21 as the field. In the first step, this target pattern is scaled by a factor of 0.5 so as form a pattern having the same equal line:space configuration, however the pitch is reduced by a factor of 0.5 (e.g., all 100 nm lines are 50 nm lines in the scaled pattern). This scaled pattern is then combined with the original target pattern. In the current example, the target pattern and the scaled pattern are combined utilizing the Boolean function of logical "OR". Performing this Boolean OR function essentially requires overlaying the scaled pattern on the target pattern, and then wherever +1 areas are present on −1 areas, because the +1 areas define the bright areas of the target pattern to be printed, the combined mask pattern includes the +1 areas. Referring to FIG. 3, which illustrates the combined mask pattern, in the resulting mask pattern there is a +1 area 23 having ½ the width of an original line in the target pattern disposed in each −1 area 21. It is further noted that preferably the scaled pattern is positioned relative to the target pattern prior to combining the patterns such that the +1 line area 23 having a reduced width resides in the middle of the −1 area 21. FIG. 3 also illustrates the imaging results obtained by imaging the combined mask pattern. As shown, the aerial image obtained utilizing the combined mask of FIG. 3 allows for the imaging of the features 27 contained in the target pattern.

Figure 4:
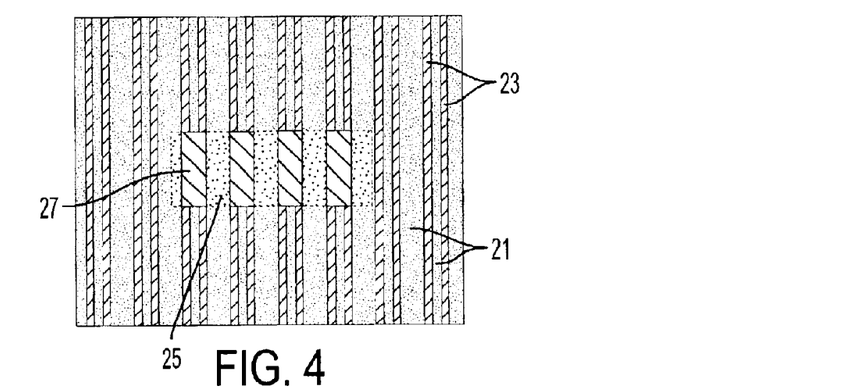
FIG. 4 illustrates another exemplary-mask formed in accordance with the present invention and the results obtained by imaging the mask.

FIG. 4 illustrates a mask that obtains the same results as the mask of FIG. 3. The mask illustrated in FIG. 4 can be obtained by subtracting the scaled pattern from the target pattern in the example of FIG. 2. More specifically, when subtracting the scaled pattern from the target pattern, the result will be less +1 area 23 than −1 area 21 so the image will be reversed (+1 areas will be dark and −1 areas will be bright). The actual operation performed is that once again the target pattern and the scaled pattern are overlaid with one another, and then wherever +1 areas are present on −1 areas, the subtraction process results in these areas becoming −1 areas. FIG. 4 illustrates the results of subtracting the patterns from one another, and the aerial image obtained by imaging the substrate utilizing a mask having the pattern of FIG. 4. As shown, the mask of FIG. 4 obtains the same results as the mask of FIG. 3. In both cases, the image is transformed from no image to the desired line-space pattern.

It is also possible to utilize the method of the present invention to generate a ternary CPL reticle design, which as explained above contains three types of areas in the mask, namely, +1 areas, −1 areas and 0 areas (zero transmission). The process performed to generate such ternary CPL masks is essentially the same as that performed to obtain the masks illustrates in FIGS. 3 and 4, with the exception that chrome areas 53 replace either the +1 area or the −1 area in the scaled pattern.

Figure 5:
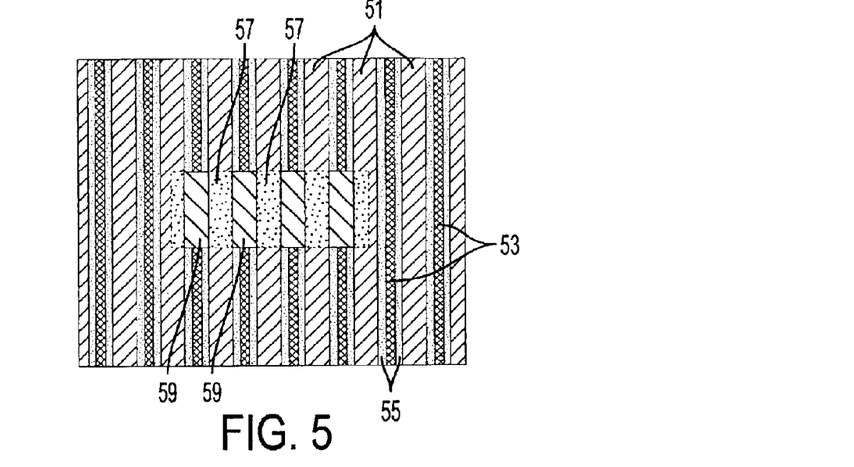
FIG. 5 illustrates the exemplary mask of FIG. 3 modified to include the use of chrome and the results obtained by imaging the mask.

More specifically, as with the example of FIG. 2, the target pattern is a pattern having +1 areas 59 to be printed and −1 areas 57 as the field. In the first step, this target pattern is scaled by a factor of 0.5 so as form a pattern having the same equal line:space configuration, however the pitch is reduced by a factor of 0.5 (e.g., all 100 nm lines are 50 nm lines in the scaled pattern). The +1 areas in the scaled pattern are then replaced with chrome areas 53. The scaled pattern is then combined with the original target pattern. In the current example, the target pattern and the scaled pattern are combined utilizing the Boolean function of "Exclusive OR". Performing this Boolean XOR function essentially requires overlaying the scaled pattern on the target pattern, and then wherever chrome areas 53 are present on −1 areas 55, the chrome area 57 remains in the final mask pattern. However, wherever chrome areas 53 overlay +1 areas 51, the chrome areas 53 are removed. The result of the XOR function is illustrated in FIG. 5. As shown, the combined mask pattern includes chrome areas 53 having ½ the width of an original line in the target pattern disposed in each −1 area 55. It is again noted that preferably the scaled pattern is positioned relative to the target pattern prior to combining the patterns such that the chrome areas 53 having a reduced width resides in the middle of the −1 areas 55. As also shown in FIG. 5, the aerial image obtained utilizing the combined mask of FIG. 5 allows for the imaging of the features 59 contained in the target pattern.

Figure 6:
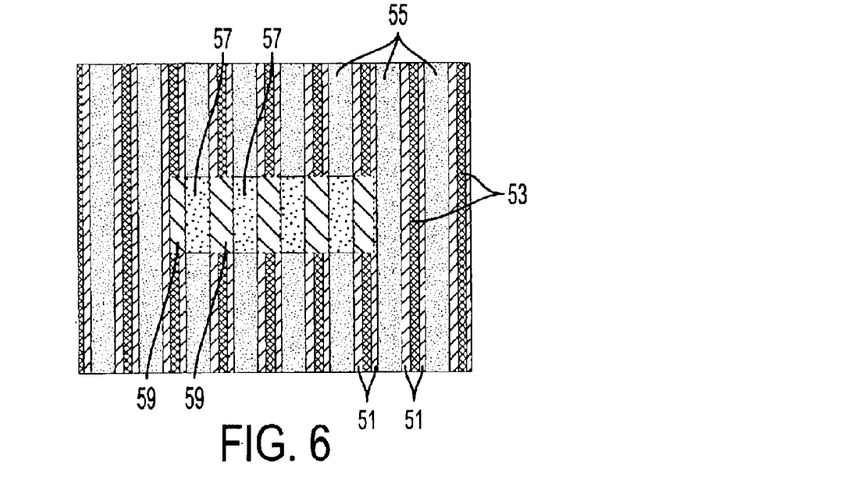
FIG. 6 illustrates the exemplary mask of FIG. 4 modified to include the use of chrome and the results obtained by imaging the mask.

FIG. 6 illustrates that the same result as obtained in FIG. 5 can be obtained by performing the Boolean "AND" function between the scaled pattern, which incorporates the use of chrome features 53 in the manner described above in conjunction with FIG. 5. More specifically, when performing the "AND" function, the combined mask pattern includes chrome areas 53 having ½ the width of an original line in the target pattern disposed in each +1 area 51, each of which is separated by −1 areas 55. As with the example of FIG. 5, preferably the scaled pattern is positioned relative to the target pattern prior to combining the patterns such that the chrome areas 53 having a reduced width resides in the middle of the +1 areas 51. The resulting aerial image obtained utilizing the combined mask of FIG. 6 also allows for the imaging of the features 59 contained in the target pattern, as is shown in FIG. 6.

The foregoing examples illustrate how a target pattern can be utilized in a substantially automated process to generate a mask design (i.e., the combined mask) for reproducing the target pattern. While the present invention has been illustrated in conjunction with a pattern having an equal line:space ratio, it is not so limited. Indeed, the present invention can be utilized in conjunction with complex pattern designs.

Figure 7A:
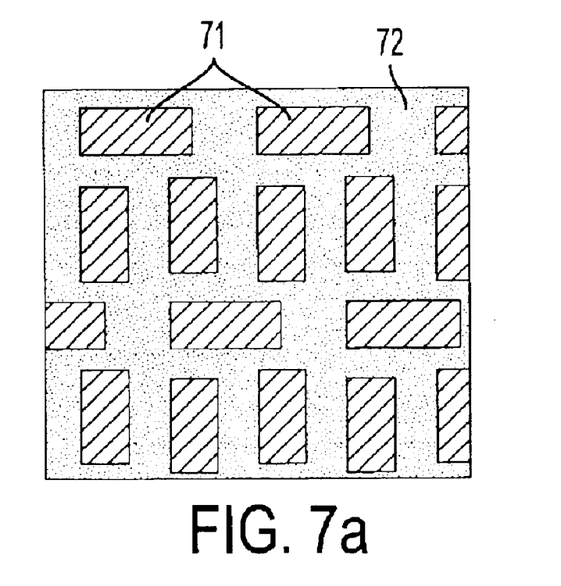
FIGS. 7a and 7b illustrate a complex contact hole pattern and the results obtained by imaging the pattern with a mask reticle formed directly from the complex contact hole pattern.
Figure 7B:
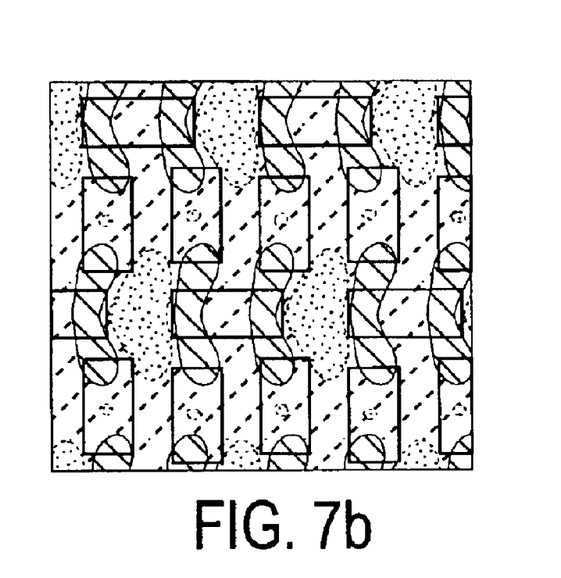

As another example, FIG. 7a illustrates an exemplary target pattern comprising a contact hole array, which includes contact holes 71 to be printed and the field 72. FIG. 7b illustrates the result of imaging a substrate utilizing a mask embodying the target pattern designed utilizing, for example +1 areas to represent the contact holes 71 and −1 areas to represent the field 72. As shown, in FIG. 7b, the resulting image has no resemblance to the desired target pattern.

Figure 8:
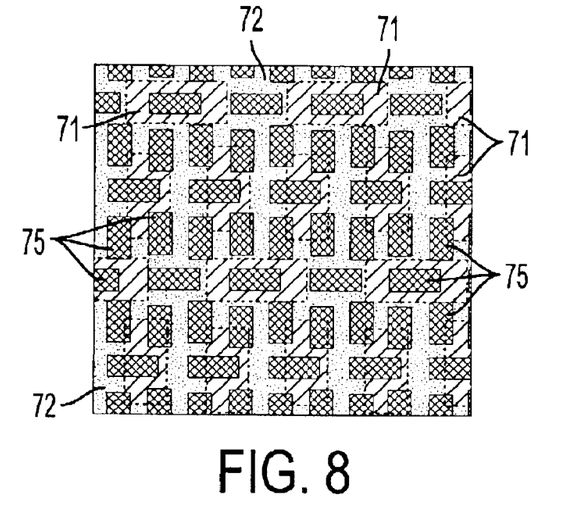
FIG. 8 illustrates the spatial frequency doubled pattern generated in accordance with the present invention corresponding to the target contact hole pattern of FIG. 7a overlaid on top of the target contact hole pattern.
Figure 9A:
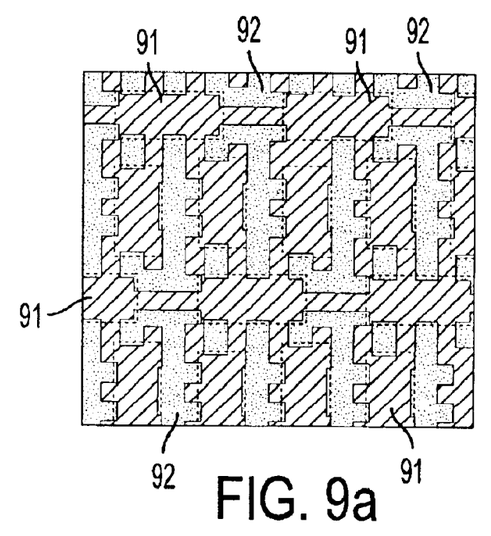
FIGS. 9a and 9b illustrate the combined pattern generated in accordance with the present invention corresponding to the spatial frequency doubled pattern illustrated in FIG. 8 and the results obtained by imaging the combined pattern.
Figure 9B:
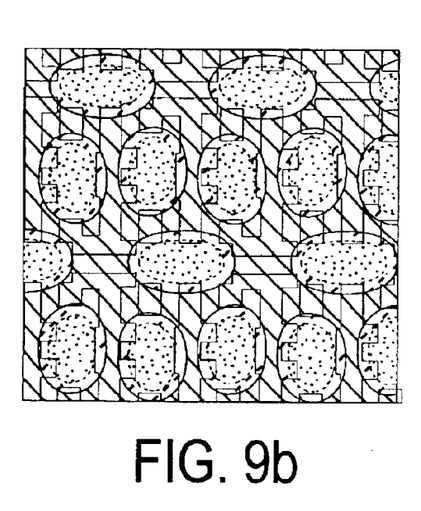
Figure 10:
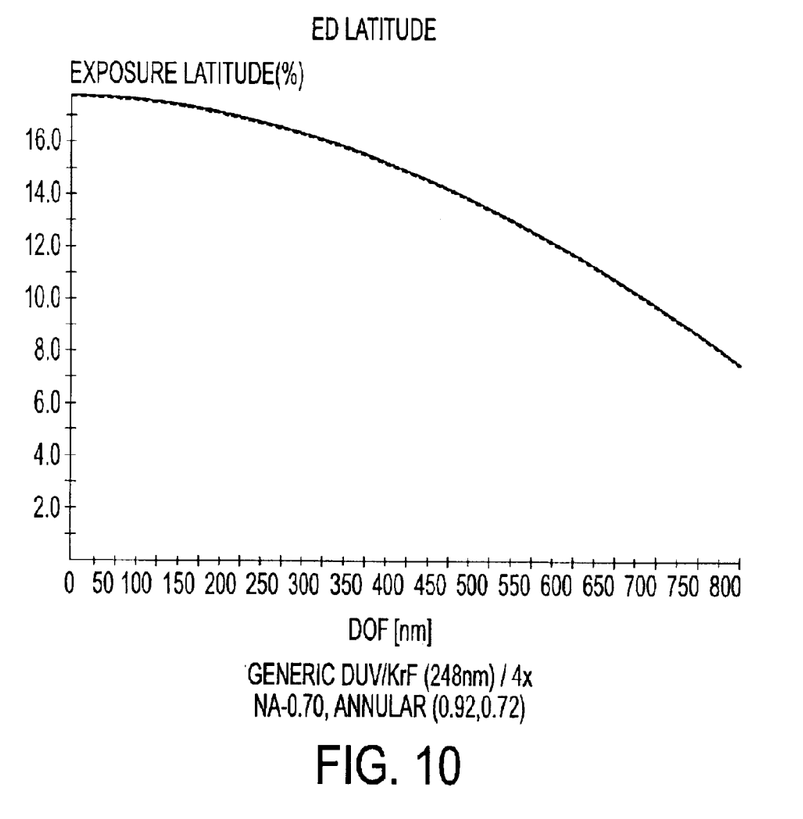

However, by utilizing the method of the present invention, it is possible to generate a mask pattern capable of imaging the target pattern of FIG. 7a. As stated above, the first step in the process is scaling the target pattern by a factor of 0.5, so as to create a spatial frequency doubled pattern of the target pattern. The scaled pattern is illustrated in FIG. 8 overlaid on the original pattern. Referring to FIG. 8, the original pattern is represented by elements 71 and 72, and the spatial frequency doubled pattern is represented by elements 75. The next step entails combining the scaled pattern and the original pattern. This is accomplished in the same manner as discussed above in conjunction with the example of FIG. 3. Specifically, the scaled pattern and the target pattern are "OR"ed together. Accordingly, +1 areas are formed in the combined mask wherever the original contact holes 71 shown in FIG. 7a and the contact holes 75 shown in FIG. 8 are present. The result, which is the combined mask, is illustrated in FIG. 9a. The results of utilizing the combined mask to image the wafer are set forth in FIG. 9b. As shown in the aerial image of FIG. 9b, the combined mask is capable of imaging the target pattern. FIG. 10 shows the process window derived from the simulation of FIG. 9b.

It is noted that in the foregoing example, the Boolean function performed to combine the scaled pattern and the target pattern was an "OR" function due to the fact that it was a dark field mask and the objective was to obtain a chromeless mask design. Alternatively, if a clear field mask was being utilized and the objective remained a chromeless mask design, the combined mask would be obtained by subtracting the scaled pattern from the original target pattern.

Figure 11A:
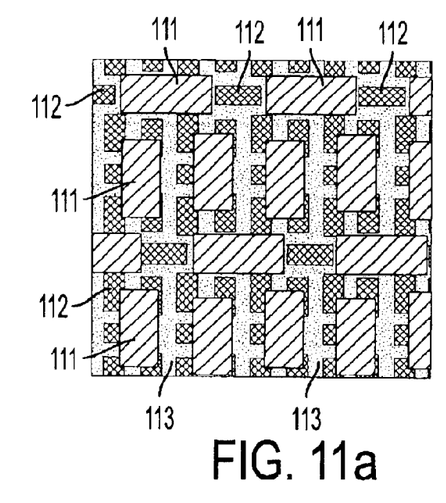
Figure 11B:
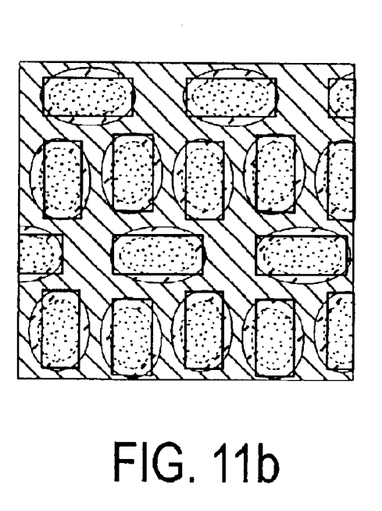
Figure 12:
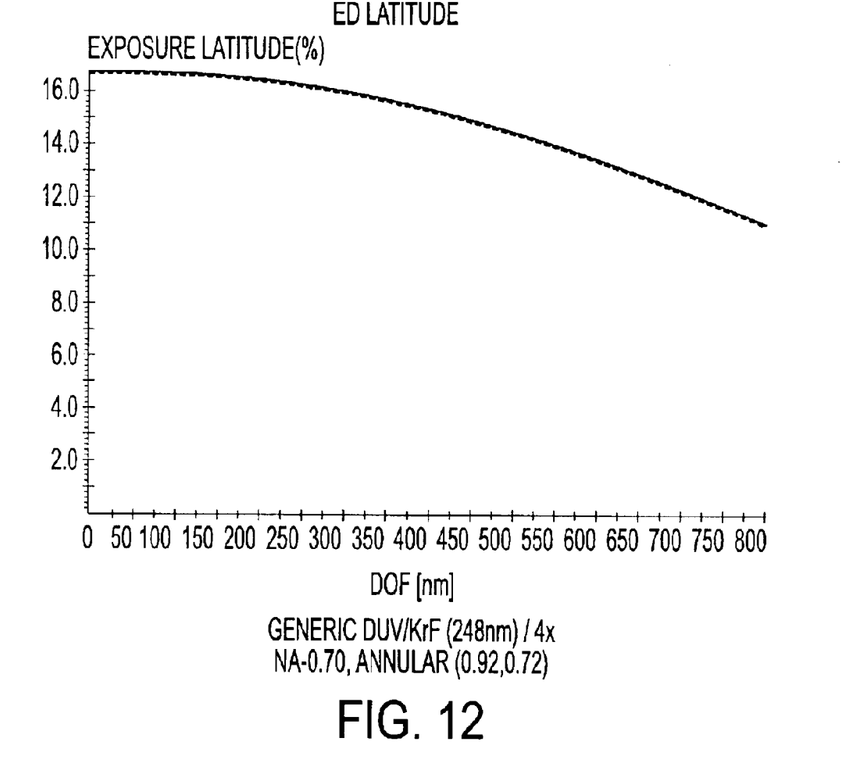

It is also possible to add chrome to the combined mask pattern when processing complex patterns in a manner similar to that described above in conjunction with the examples shown in FIGS. 5 and 6. In general, it is desirable to add chrome features to the background when utilizing a dark field mask, and in case of the clear field, the chrome should be added to the features to be printed. FIG. 11a illustrates the combined mask for patterning the contact hole pattern of FIG. 7a which utilizes chrome (i.e., a ternary mask design). As shown, the mask includes +1 areas 111, chrome areas 112 and −1 areas 113. FIG. 11b illustrates the aerial image resulting from imaging the mask of FIG. 11a. As shown, the mask accurately reproduces the target pattern. FIG. 12 shows the process window derived from the simulation of FIG. 11b.

Figure 13A:
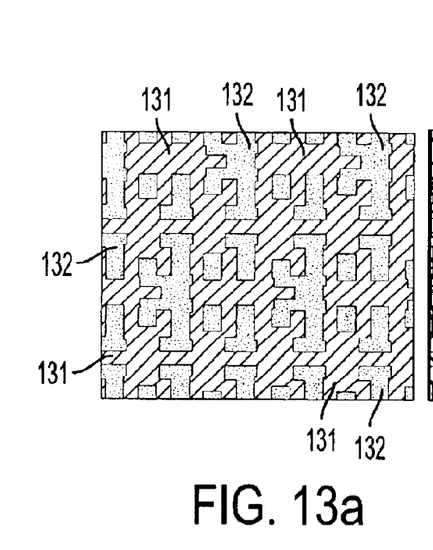
Figure 13B:
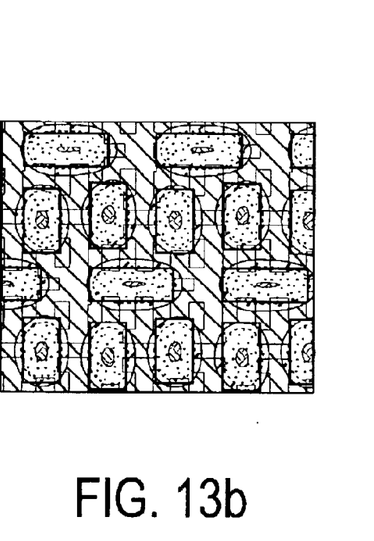

Another degree of freedom that can be controlled by the designer is where the spatial frequency doubled pattern is placed relative to the original pattern. This can be very useful for generating patterns that are more manufacturable. In contrast to FIG. 9a, FIG. 13a shows the resulting mask pattern when the spatial frequency doubled pattern (utilized to form the mask in FIG. 9a) was shifted in the x direction by ¼ of the horizontal pitch. This shifting of the condition results in a pattern that is much more conducive to reticle manufacturing constraints, because the resulting geometries (i.e., patterns) may be larger and reduce the number of small features. FIG. 13b illustrates the aerial image resulting from imaging the mask of FIG. 13a.

Of course, variations of the foregoing method of forming a mask pattern are also possible. For example, when generating the scaled pattern, it is possible to vary the equal line:space dimensions of the original target such that in the scaled pattern lines have a slightly larger width than the spaces, or vise verse. Such "sizing" of the scaled pattern can function to provide an optimal balance of the diffraction orders (i.e., it is possible to increase or decrease the amount of energy in the zero as necessary to improve imaging).

Figure 14:
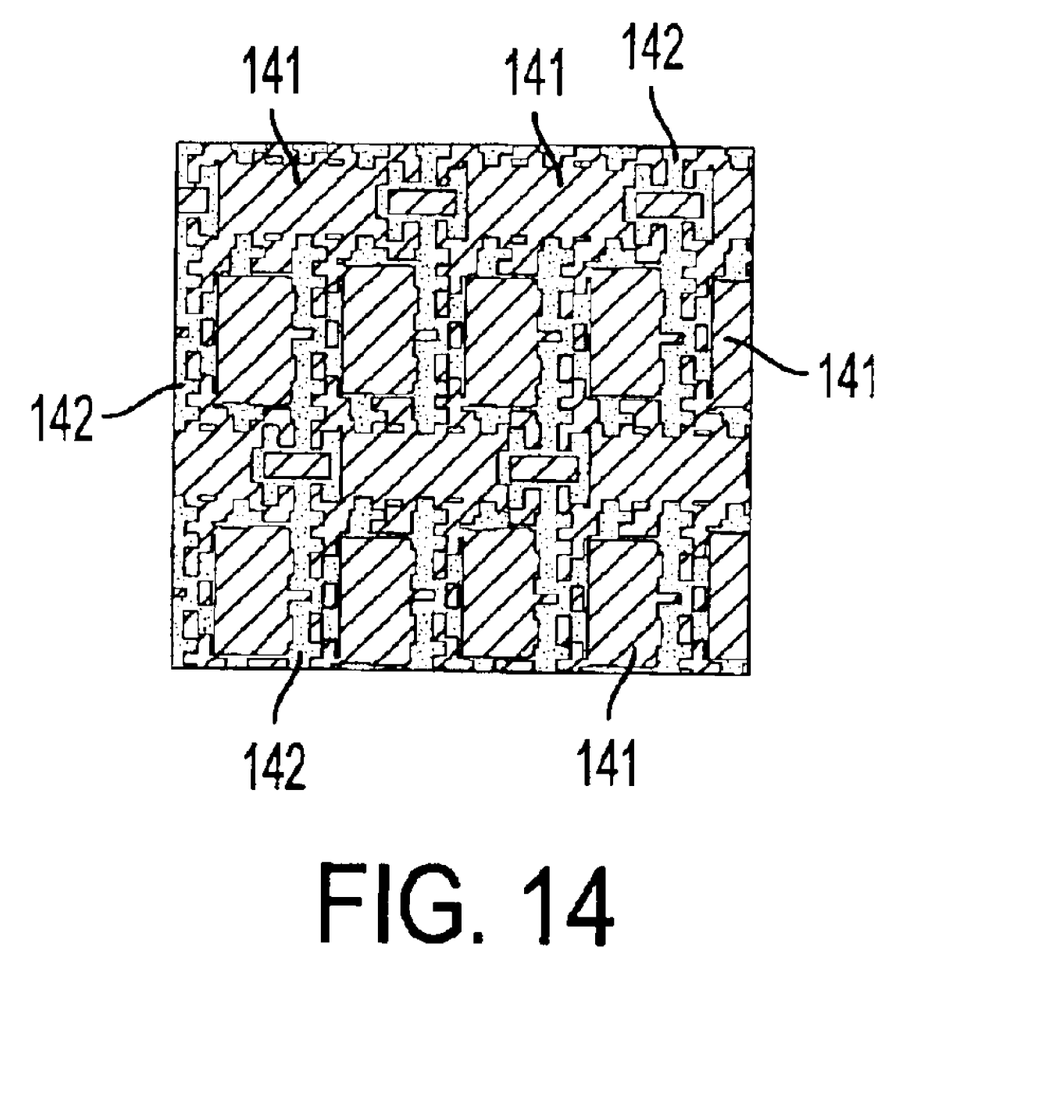

Another variation of the mask generation process of the present invention is to double the frequency components of the target pattern twice to form the scaled pattern prior to combining the scaled pattern with the target pattern. FIG. 14 contains an image of a CPL design having +1 areas 141 and −1 areas 142 derived from doubled and quadrupled components of the contact hole pattern of FIG. 7a. However, when a pattern with such high spatial frequencies is used, the result is a much more complex pattern and one that may not be manufacturable with current reticle manufacturing technology. But in principle, the pattern could be repeatedly scaled by 50% each time double the spatial frequency components and all the reconstructed in a manner to create a CPL design which will print the original desired periodic pattern.

Figure 15:
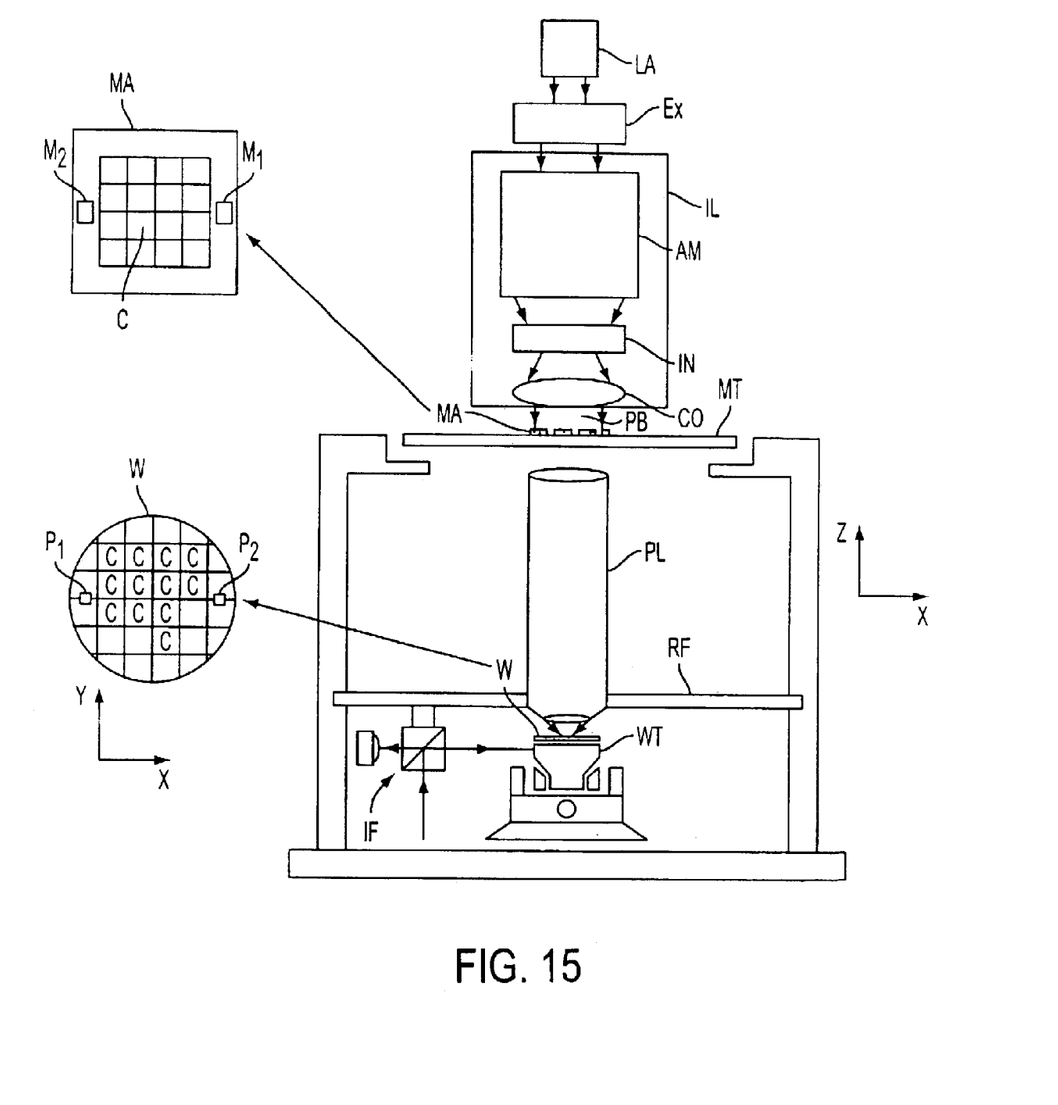
FIG. 15 schematically depicts a lithographic projection apparatus suitable for use with the masks designed with the aid of the current invention.

FIG. 15 schematically depicts a lithographic projection apparatus suitable for use with the masks designed with the aid of the current invention. The apparatus comprises:

- a radiation system Ex, IL, for supplying a projection beam PB of radiation. In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp, excimer laser or plasma discharge source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 15 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 15. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

As noted above, the present invention provides important advantages over the prior art. Most importantly, by providing an automated approach for forming an initial mask design, a substantial part of the mask design effort that in the past was performed by a trial and error process by the mask designer is now eliminated. Accordingly, the time and effort associated with mask design is advantageously reduced. Moreover, highly skilled mask designers are no longer required for producing a quality mask, as the level of skill required for optimizing the initial mask produced by the method of the present invention is less than that necessary for designing a complete mask.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A method of generating a mask for use in an imaging system, said method comprising the steps of:
   (a) determining a target pattern representing a circuit design to be printed on a substrate;
   (b) generating a first pattern by scaling said target pattern by a factor of less than 1; and
   (c) generating a second pattern by performing a Boolean operation which combines said target pattern and said first pattern.

2. The method of claim 1, wherein said target pattern is scaled by a factor of 0.5 to generate said first pattern.

3. The method of claim 2, wherein said target pattern has spatial frequency components, and said first pattern has spatial frequency components which are double the spatial frequency components of said target pattern.

4. The method of claim 1, wherein said target pattern is a line-space pattern having a plurality of lines and spaces, each said line and said space having an equal width dimension.

5. The method of claim 1, wherein said second pattern represents a mask pattern for printing said target pattern.

6. The method of claim 1, wherein said first pattern is combined with a same portion of said target pattern that is utilized to generate said first pattern.

7. An apparatus for generating a mask for use in printing a target pattern on a substrate, said method comprising the steps of:
- means for determining a target pattern representing a circuit design to be printed on a substrate;
- means for generating a first pattern by scaling said target pattern by a factor of less than 1; and
- means for generating a second pattern by performing a Boolean operation which combines said target pattern and said first pattern.

8. The apparatus of claim 7, wherein said target pattern is scaled by a factor of 0.5 to generate said first pattern.

9. The apparatus of claim 8, wherein said target pattern has spatial frequency components, and said first pattern has spatial frequency components which are double the spatial frequency components of said target pattern.

10. The apparatus of claim 7, wherein said target pattern is a line-space pattern having a plurality of lines and spaces, each said line and said space having an equal width dimension.

11. The method of claim 7, wherein said second pattern represents a mask pattern for printing said target pattern.

12. The apparatus of claim 7, wherein said first pattern is combined with a same portion of said target pattern that is utilized to generate said first pattern.

13. A computer program product for controlling a computer comprising a recording medium readable by the computer, means recorded on the recording medium for directing the computer to generate at least one file corresponding to a mask for use in a lithographic imaging process, said generation of said file comprising the steps of:
- (a) determining a target pattern representing a circuit design to be printed on a substrate;
- (b) generating a first pattern by scaling said target pattern by a factor of less than 1; and
- (c) generating a second pattern by performing a Boolean operation which combines said target pattern and said first pattern.

14. The computer program product of claim 13, wherein said target pattern is scaled by a factor of 0.5 to generate said first pattern.

15. The computer program product of claim 14, wherein said target pattern has spatial frequency components, and said first pattern has spatial frequency components which are double the spatial frequency components of said target pattern.

16. The computer program product of claim 13, wherein said target pattern is a line-space pattern having a plurality of lines and spaces, each said line and said space having an equal width dimension.

17. The computer program product of claim 14, wherein said second pattern represents a mask pattern for printing said target pattern.

18. The computer program product of claim 13, wherein said first pattern is combined with a same portion of said target pattern that is utilized to generate said first pattern.

* * * * *